United States Patent [19]
Koga

[11] Patent Number: 5,675,547
[45] Date of Patent: Oct. 7, 1997

[54] ONE TIME PROGRAMMABLE READ ONLY MEMORY PROGRAMMED BY DESTRUCTION OF INSULATING LAYER

[75] Inventor: Shinichi Koga, Nagasaki, Japan

[73] Assignee: Sony Corporation, Tokyo, Japan

[21] Appl. No.: 656,407

[22] Filed: May 30, 1996

[30] Foreign Application Priority Data

Jun. 1, 1995 [JP] Japan .................... 7-156689

[51] Int. Cl.⁶ .................. G11C 13/00; G11C 11/24
[52] U.S. Cl. .................... 365/230.03; 365/149
[58] Field of Search .................. 365/149, 189.04, 365/189.05, 230.03, 100, 230.08

[56] References Cited

U.S. PATENT DOCUMENTS 4,056,811  11/1977  Baker ...................... 365/189.01

Primary Examiner—Terrell W. Fears
Attorney, Agent, or Firm—William S. Frommer; Alvin Sinderbrand

[57] ABSTRACT

A volatile storage device including a nonvolatile storage block. The nonvolatile storage block includes a plurality of memory cells arranged in the form of matrix at the intersections of bit lines and word lines. Each memory cell includes an address selecting transistor and a capacitor connected in series between each bit line and a cell plate line. Accordingly, additional information including production history, test results, and product information can be nonvolatily stored in the volatile storage device.

3 Claims, 4 Drawing Sheets

ONE TIME PROGRAMMABLE READ ONLY MEMORY PROGRAMMED BY DESTRUCTION OF INSULATING LAYER

BACKGROUND OF THE INVENTION

The present invention relates to a semiconductor storage device capable of storing not only volatile information but also nonvolatile information.

In a volatile information storage semiconductor device, information including a wafer condition after manufacturing and the results of electrical tests are stored after resin sealing by specially preparing a fuse ROM and fusing the fuse ROM to thereby write the results of electrical tests to each chip. Thus, the information is nonvolatily stored even when electric power to the chip is cut off. However, to electrically write the information to the fuse ROM, a large buffer for obtaining a flow of current to fuse the fuse ROM is required, causing an excess area per storage capacity. In another method of writing the information by using a laser trimmer, the buffer for obtaining the flow of fusing current is not required, but the fuse ROM must be fused by the laser trimmer after storing the test results into another storage device. Accordingly, there is a problem in positioning for trimming, yet causing an increase in chip area.

SUMMARY OF THE INVENTION

The semiconductor storage device according to the present invention comprises a plurality of first memory cells for storing volatile information; a read/write control means for controlling read/write operation to the first memory cells; a plurality of second memory cells for nonvolatily storing information, each of the second memory cells having a cell selecting transistor and a capacitor connected at one end thereof to the cell selecting transistor; a nonvolatile information storage control means for selectively applying a given voltage to the other end of the capacitor in an arbitrary one of the second memory cells to thereby destroy the capacitor and nonvolatily store information into the arbitrary second memory cell; and a nonvolatile information reading means for selectively switching on the cell selecting transistors in the second memory cells to perform read/write operation to the second memory cells, so as to identify the second memory cell whose capacitor has been destroyed and thereby read the information nonvolatily stored into the second memory cell.

Preferably, each of the first memory cells includes a cell selecting transistor and a capacitor connected in series between a bit line and a common cell plate line.

In the above-mentioned semiconductor storage device, a given voltage enough to destroy a dielectric film constituting the capacitor of an arbitrary one of the second memory cells is applied to between the electrodes of the capacitor, thereby nonvolatily storing information into the arbitrary second memory cell.

Further, the information nonvolatily stored in the arbitrary second memory cell can be read out by utilizing the fact that by preliminarily applying a potential different from a cell plate potential applied to a storage node of the second memory cell whose capacitor dielectric film has been destroyed, to storage nodes of the other second memory cells whose capacitor dielectric films have not been destroyed, the potential different from the cell plate potential in the second memory cell whose capacitor dielectric film has been destroyed can be read out. Further, in the case that each second memory cell has the same structure as that of each first memory cell as having a single transistor and a single capacitor, no special manufacturing steps for mounting the second memory cells are required.

DETAILED DESCRIPTION OF THE PREFERRED EMBODIMENTS

Figure 1:
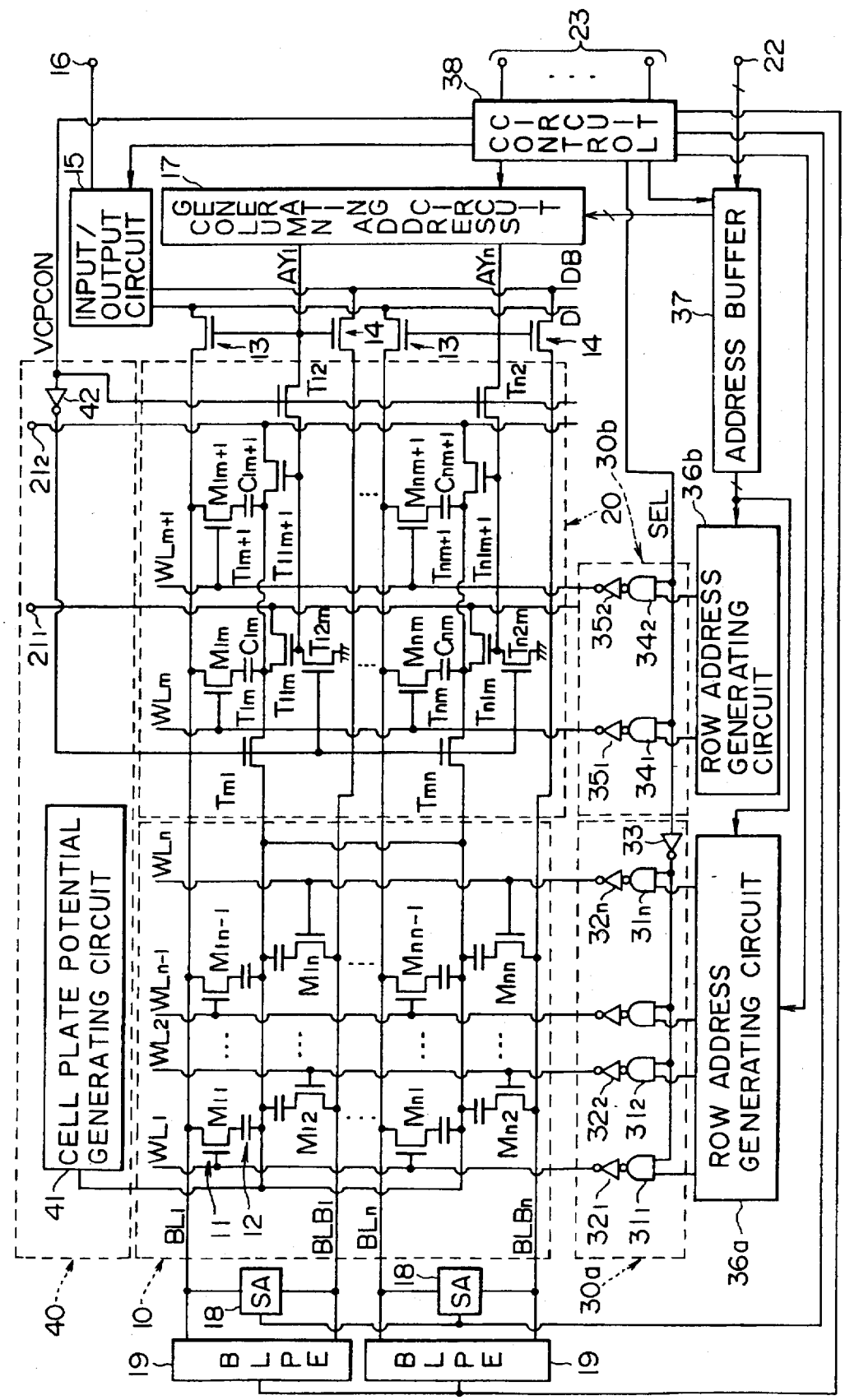
FIG. 1 is a circuit diagram showing a nonvolatile storage block mounted in a semiconductor storage device according to a preferred embodiment of the present invention.

A preferred embodiment of the present invention will now be described in detail with reference to the drawings. FIG. 1 is a circuit diagram showing the configuration of a semiconductor storage device according to a preferred embodiment of the present invention. This preferred embodiment is an application of the present invention to a DRAM (dynamic random access memory).

The semiconductor storage device according to the preferred embodiment includes a memory cell array 10 having a plurality of usual memory cells for storing usual information, and a nonvolatile information storing memory cell array 20 having a plurality of memory cells for nonvolatily storing information.

The memory cell array 10 includes a plurality of memory cells M11 to Mnn arranged in the form of matrix, a plurality of word lines WL1 to WLn arranged in the row direction, and a plurality of bit line pairs (BL1 and BLB1) to (BLn and BLBn) arranged in the column direction. The odd ones of the word lines WL1 to WLn are connected to the odd rows of the memory cells M11 to Mnn, and the even ones of the word lines WL1 to WLn are connected to the even rows of the memory cells M11 to Mnn. On the other hand, bit lines BL1 to BLn are connected to the odd rows of the memory cells M11 to Mnn, and the bit lines BLB1 to BLBn are connected to the even rows of the memory cells M11 to Mnn.

Each of the memory cells M11 to Mnn includes a cell selecting n-channel MOS transistor 11 and a capacitor 12. The drain of each transistor 11 is connected to the corresponding bit line; the gate of each transistor 11 is connected to the corresponding word line; and the source of each transistor 11 is connected to one end of the corresponding capacitor 12. The other ends of all the capacitors 12 in the memory cells M11 to Mnn are connected electrically and structurally to a common cell plate electrode.

The bit lines BL1 to BLn are connected to a common data line D through respective input/output gates 13 each constituted of an n-channel MOS transistor. Similarly, the bit lines BLB1 to BLBn are connected to a common data line DB through respective input/output gates 14 each constituted of an n-channel MOS transistor. The data lines D and DB are connected to an input/output circuit 15. The input/output circuit 15 is connected to an input/output terminal 16. The gates of the n-channel MOS transistor constituting the input/output gates 13 and 14 are connected to outputs of a column address generating circuit 17 for selecting arbitrary columns. In FIG. 1, AY1 to AYn denote column address signals output from the column address generating circuit 17.

Each of the bit line pairs (BL1 and BLB1) to (BLn and BLBn) is connected to a sense amplifier (shown by SA in FIG. 1) 18 for amplifying a potential difference between the bit lines in each pair and a bit line pair precharging and equalizing circuit (shown by BLPE in FIG. 1) 19 for precharging each bit line pair at a level of ½ $V_{cc}$ and equalizing the bit lines in each pair.

The nonvolatile information storing memory cell array 20 includes a word line WLm and a plurality of memory cells M1m to Mnm connected to the word line WLm. The memory cells M1m to Mnm respectively have cell selecting n-channel MOS transistors T1m to Tnm and capacitors C1m to Cnm. The drains of the transistors T1m to Tnm are respectively connected to the bit lines BL1 to BLn; the gates of the transistors T1m to Tnm are connected commonly to the word line WLm; and the sources of the transistors T1m to Tnm are respectively connected to first ends of the capacitors C1m to Cnm. Second ends of the capacitors C1m to Cnm on the cell plate electrode side are respectively connected to the sources of n-channel MOS transistors T11m to Tn1m. The drains of the transistors T11m to Tn1m are connected commonly to a cell plate potential terminal $21_1$. The gates of the transistors T11m to Tn1m are respectively connected to the sources of n-channel MOS transistors T12 to Tn2. The drains of the transistors T12 to Tn2 are respectively connected to the outputs of the column address generating circuit 17, so as to input the column address signals AY1 to AYn.

Similarly, the memory cell array 20 further includes a word line WLm+1 and a plurality of memory cells M1m+1 to Mnm+1 connected to the word line WLm+1. The memory cells M1m+1 to Mnm+1 respectively have cell selecting n-channel MOS transistors T1m+1 to Tnm+1 and capacitors C1m+1 to Cnm+1. The drains of the transistors T1m+1 to Tnm+1 are respectively connected to the bit lines BL1 to BLn; the gates of the transistors T1m+1 to Tnm+1 are connected commonly to the word line WLm+1; and the sources of the transistors T1m+1 to Tnm+1 are respectively connected to first ends of the capacitors C1m+1 to Cnm+1. Second ends of the capacitors C1m+1 to Cnm+1 on the cell plate electrode side are respectively connected to the sources of n-channel MOS transistors T11m+1 to Tn1m+1. The drains of the transistors T11m+1 to Tn1m+1 are connected commonly to a cell plate potential terminal $21_2$. The gates of the transistors T11m+1 to Tn1m+1 are respectively connected to the sources of the n-channel MOS transistors T12 to Tn2.

The semiconductor storage device according to this preferred embodiment further includes word line selecting logic sections 30a and 30b respectively connected to the memory cell arrays 10 and 20, row address generating circuits 36a and 36b respectively connected to the logic sections 30a and 30b, an address buffer 37 connected to the column address generating circuit 17 and the row address generating circuits 36a and 36b, a control circuit 38, and a cell plate potential control section 40.

The logic section 30a includes a plurality of NAND gates $31_1$ to $31_n$ connected at their respective first inputs to the outputs of the row address generating circuit 36a, a plurality of inverters $32_1$ to $32_n$ connected at their respective inputs to the outputs of the NAND gates $31_1$ to $31_n$ and connected at their respective outputs to the word lines WL1 to WLn, and an inverter 33 connected at its output to the second inputs of the NAND gates $31_1$ to $31_n$. On the other hand, the logic section 30b includes two NAND gates $34_1$ and $34_2$ connected at their first inputs to a control circuit 38, and two inverters $35_1$ and $35_2$ connected at their inputs to the outputs of the NAND gates $34_1$ and $34_2$ and connected at their outputs to the word lines WLm and WLm+1. The input of the inverter 33 and the second inputs of the NAND gates $34_1$ and $34_2$ input a word line select signal SEL from the control circuit 38.

The address buffer 37 is connected to an address input terminal 22 to latch an address signal input from the address input terminal 22 and output the address signal to the column address generating circuit 17 and the row address generating circuits 36a and 36b. On the basis of the output from the address buffer 37, the column address generating circuit 17 generates a column address signal for selecting an arbitrary column, and the row address generating circuits 36a and 36b generate a row address signal for selecting an arbitrary row.

The control circuit 38 is connected to a plurality of control signal input terminals 23 for inputting control signals such as a chip select signal, output enable signal, and write enable signal, and also inputting control signals for writing and reading of information to the memory cell array 20. On the basis of the control signals input from the control signal input terminals 23, the control circuit 38 applies control signals in addition to the above-mentioned word line select signal SEL to the address buffer 37, the column address generating circuit 17, the row address generating circuits 36a and 36b, the input/output circuit 15, the sense amplifiers 18, the bit line pair precharging and equalizing circuits 19, and the cell plate potential control section 40.

The cell plate potential control section 40 includes a cell plate potential generating circuit 41 for generating a given cell plate potential, a plurality of n-channel MOS transistors Tm1 to Tmn whose drains are connected to the output of the cell plate potential generating circuit 41, and an inverter 42 whose output is connected to the gates of the transistors Tm1 to Tmn. The output of the cell plate potential generating circuit 41 is connected commonly to the cell plate electrodes of the capacitors 12 in the memory cells M11 to Mnn of the memory cell array 10. The sources of the transistors Tm1 to Tmn are connected to the drains of the transistors T11m to Tn1m and to the drains of the transistors T11m+1 to Tn1m+1 in the memory cell array 20. The input of the inverter 42 receives a cell plate potential generating circuit connection signal VCPCON from the control circuit 38. The cell plate potential generating circuit connection signal VCPCON is also input to the gates of the transistors T12 to Tn2 in the memory cell array 20.

The will now be described with reference to FIGS. 2 and 3 the structure of the memory cells M11 to Mnn and M1m to Mnm+1 and a method of storing information in the memory cells M1m to Mnm+1 in the memory cell array 20.

Figure 2:
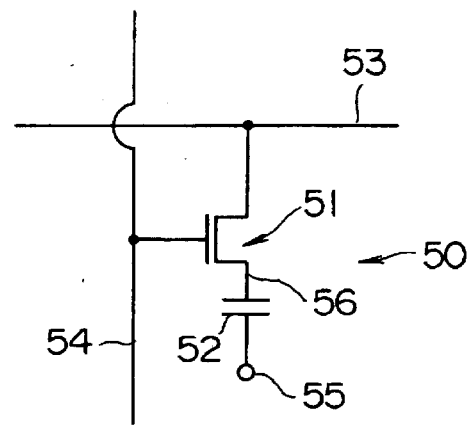
FIG. 2 is an equivalent circuit diagram of each nonvolatile storage cell shown in FIG. 1.

FIG. 2 is a circuit diagram showing an equivalent circuit of the memory cells M11 to Mnn and M1m to Mnm+1 (which will be hereinafter represented by reference numeral 50). The memory cell 50 includes a cell selecting n-channel MOS transistor 51 (which represents the transistors 11 in the memory cell array 10 and the transistors T1m to Tnm+1 in the memory cell array 20), and a capacitor 52 (which represents the capacitors 12 in the memory cell array 10 and the capacitors C1m to Cnm+1 in the memory cell array 20). The drain of the transistor 51 is connected to a bit line 53; the gate of the transistor 51 is connected to a word line 54; and the source of the transistor 51 is connected to one end of the capacitor 52. The other end of the capacitor 52 is connected to a cell plate electrode 55. A storage node 56 is formed between the source of the transistor 51 and the capacitor 52.

Figure 3:
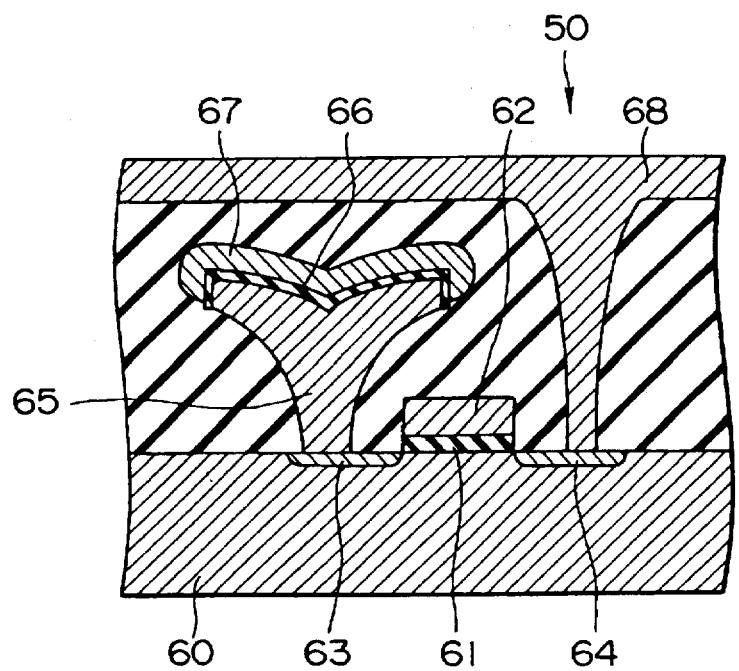
FIG. 3 is a sectional view showing a typical structure of each nonvolatile storage cell shown in FIG. 1.

FIG. 3 is a sectional view showing a typical structure of the memory cell 50. A gate electrode 62 corresponding to the word line 54 shown in FIG. 2 is formed on a silicon substrate 60 through a gate oxide film 61. A source electrode 63 and a drain electrode 64 are formed in the upper surface of the silicon substrate 60 at opposite positions with respect to the gate electrode 62. A storage node 65 corresponding to the storage node 56 shown in FIG. 2 is formed on the source electrode 63. A capacitor oxide film 66 corresponding to the capacitor 52 shown in FIG. 2 is formed on the storage node 65. A cell plate 67 corresponding to the cell plate electrode 55 shown in FIG. 2 is formed on the capacitor oxide film 66. A bit line 68 corresponding to the bit line 53 shown in FIG. 2 is connected to the drain electrode 64.

In usual read and write operations to the memory cell 50, the transistor 51 is turned on by the word line 54 to apply a potential from the bit line 53 to the storage node 56. This potential is stored by the capacitance of the capacitor 52, and is fetched from the bit line 53. The capacitor oxide film 66 is formed as a thin film to ensure a capacitance in a small area, so that it can be more easily destroyed than a usual transistor. In the memory cells M1m to Mnm+1 in the memory cell array 20 according to this preferred embodiment, the capacitor 52 (capacitor oxide film 60) is selectively destroyed to thereby store information. In reading the information thus stored, any memory cell whose capacitor 52 has been destroyed is identified by performing a usual read/write operation. For example, in a condition where a supply voltage is applied to the common cell plate electrode, a ground potential is written into the memory cell. By utilizing the fact that a signal potential read to the bit line from the memory cell whose capacitor 52 has been destroyed is higher than that from any other memory cell whose capacitor 52 has not been destroyed, the information nonvolatily written can be read out.

Figure 4A:
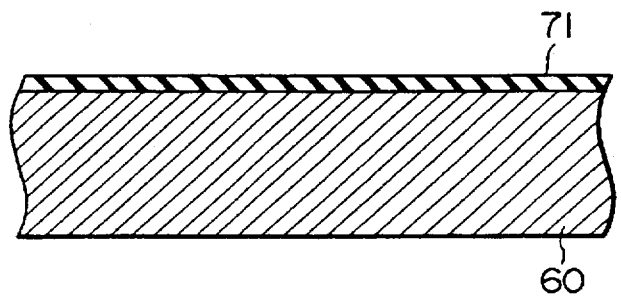
FIGS. 4A to 4G are sectional views showing a manufacturing method for the nonvolatile storage cell shown in FIG. 3.
Figure 4B:
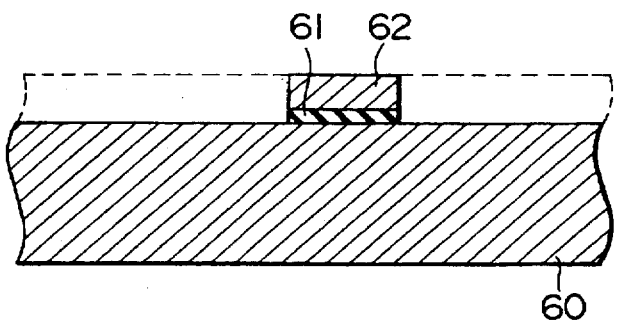
Figure 4C:
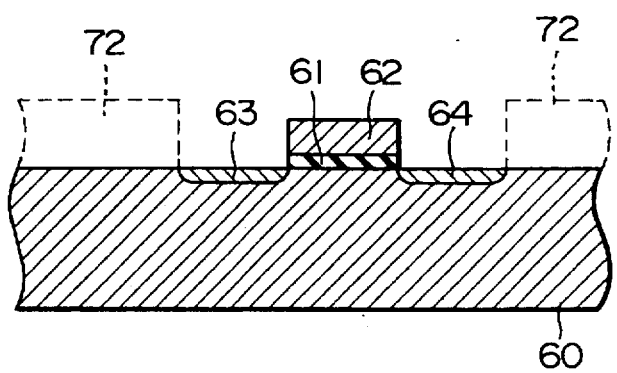
Figure 4D:
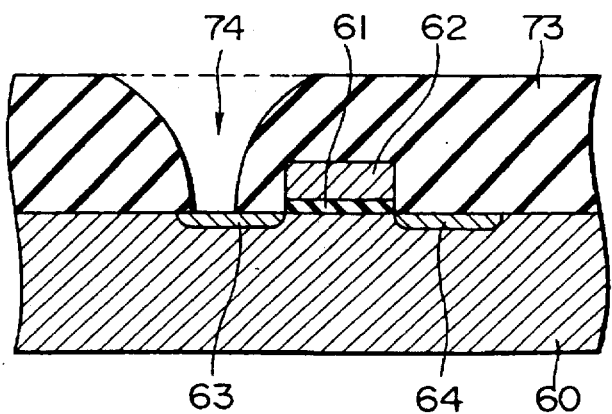

A manufacturing method for the memory cell 50 shown in FIG. 3 will now be described with reference to FIGS. 4A to 4G. As shown in FIG. 4A, the surface of a P-type silicon substrate 60 is oxidized to form an $SiO_2$ film 71 on the silicon substrate 60. As shown in FIG. 4B, a polysilicon film or the like is formed on the $SiO_2$ film 71 by CVD, for example, and photolithography and etching are then performed to form a gate oxide film 61 and a gate electrode 62. As shown in FIG. 4C, an impurity is injected and diffused into the silicon substrate 60 by using a resist 72 and the gate electrode 62 as a mask to form a source electrode 63 and a drain electrode 64. As shown in FIG. 4D, an interlayer film 73 is formed, and photolithography and etching are next performed to form an opening 74 on the source electrode 63.

Figure 4E:
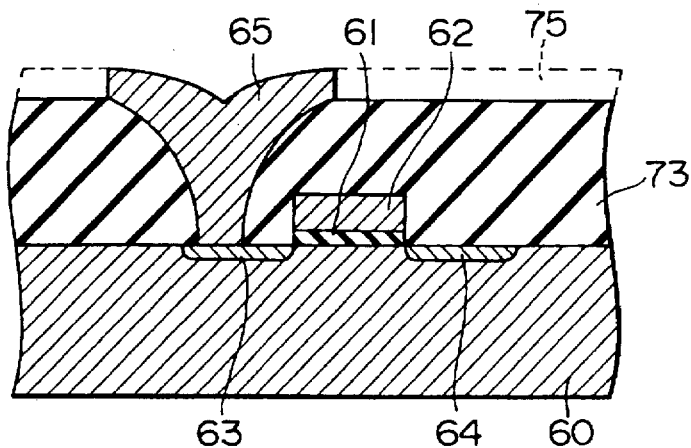
Figure 4F:
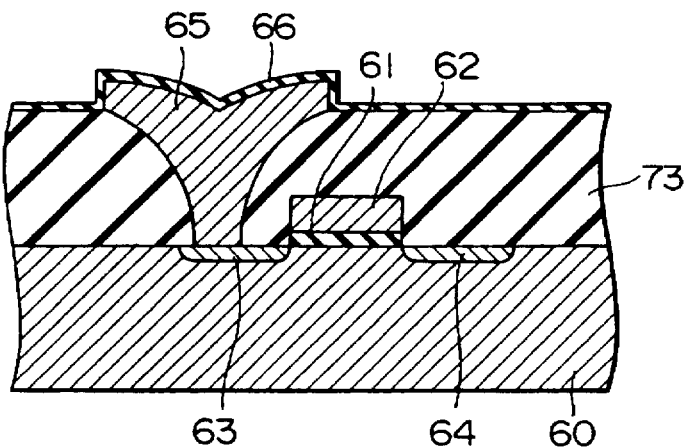
Figure 4G:
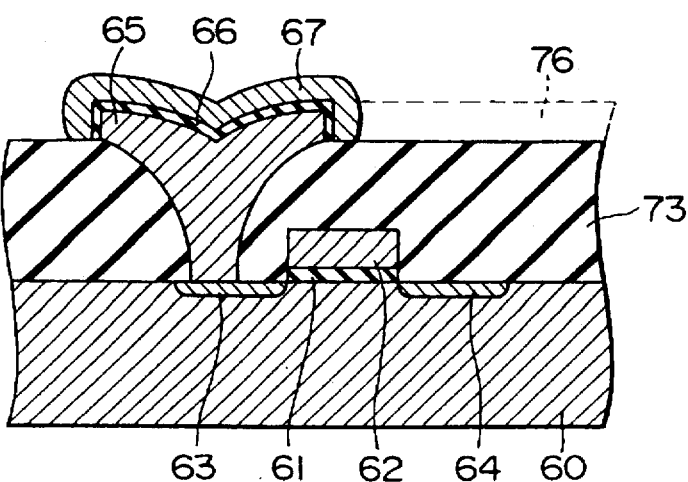

As shown in FIG. 4E, a polysilicon film 75 is formed and then processed to form a storage node 65 in the opening 74. As shown in FIG. 4F, oxidation, $Si_3N_4$ film formation, and oxidation are sequentially performed on the storage node 65 to form a capacitor oxide film 66 having a three-layer structure. The reason for formation of the three-layer structure is that if the capacitor oxide film 66 has a single-layer structure of $SiO_2$, the permittivity of the capacitor 52 becomes low to result in a low capacitance. As shown in FIG. 4G, a polysilicon film 76 is formed and then processed to form a cell plate 67. Thereafter, a bit line 68 (see FIG. 3) is formed in a manner similar to that of formation of the storage node 68.

The operation of the semiconductor storage device according to this preferred embodiment will now be described. In nonvolatily storing information in the memory cells M1m to M1m+1 of the nonvolatile information storing memory cell array 20, the cell plate potential generating circuit connection signal VCPCON is turned to "H" level. Accordingly, the transistors T12 to Tn2 go on, the transistors T12m to Tn2m go off and the column address signals AY1 to AYn are input into the gates of the transistors T11m to Tn1m+1. At the same time, the transistors Tm1 to Tmn go off and the output terminal of the cell plate potential generating circuit 41 is separated from the cell plate potential terminals $21_1$ and $21_2$. In this condition, a voltage enough to destroy the capacitors C1m to Cnm+1 of the memory cells M1m to Mnm+1 (e.g., a voltage twice the supply voltage $V_{cc}$) is applied from the cell plate potential terminals $21_1$ and $21_2$, and column addresses are input from the outside to select rows. Accordingly, the column address signals AY1 to AYn corresponding to the selected rows change from "L" level to "H" level. On the other hand, the word line select signal SEL is turned to "H" level; the word line WLm, for example, corresponding to the selected rows is turned to "H" level; and the bit lines BL1 to BLn are grounded. As a result, the given voltage from the cell plate potential terminal. $21_1$ is applied to only the cell plate electrodes of the capacitors corresponding to the selected columns, of the capacitors C1m to Cnm of the memory cells M1m to Mnm corresponding to the selected redundant rows, thereby selectively destroying the capacitors to which the given voltage has been applied. In this manner, information is nonvolatily stored according to which of the capacitors C1m to Cnm+1 of the memory cells M1m to Mnm+1 are to be destroyed.

In reading the information nonvolatily stored in any of the memory cells M1m to Mnm+1 of the memory cell array 20, the cell plate potential generating circuit connection signal VCPCON is turned to "L" level. Accordingly, the transistors T12 to Tn2 go off and the transistors Tm1 to Tmn go on, so that a cell plate potential, e.g., $V_{cc}$, output from the cell plate potential generating circuit 41 is applied to all the cell plates of the capacitors C1m to Cnm+1 of the memory cells M1m to Mnm+1. In this condition, the work line select signal SEL is turned to "H" level, and the word line WLm, for example, corresponding to the selected rows is turned to "H" level to select the memory cells M1m to Mnm. Further, the transistors T1m to Tnm are selectively turned on by the column address signals AY1 to AYn to perform read/write operation of volatile data. Accordingly, there occurs read error of data "0" from the memory cells in which the dielectric films of the capacitors have been destroyed. That is, when data "0" input from the input/output terminal 16 is written into the memory cells M1m to Mnm+1 and then read out, data "1" is read out from the memory cells in which the dielectric films of the capacitors have been destroyed. Since this read data "1" does not coincide with the input data "0", it is decided that read error has occurred at the memory cells having the destroyed capacitors. In this manner, which of the capacitors C1m to Cnm+1 of the memory cells M1m to Mnm+1 have been destroyed can be identified, thereby allowing reading of information nonvolatily stored in the memory cells M1m to Mnm+1 of the memory cell array 20.

In reading/writing volatile information to the memory cell array 10 having usual memory cells, the word line select signal SEL is turned to "L" level to allow selection of arbitrary rows of the memory cell array 10 according to the row address signals from the row address generating circuit 36a. Further, the cell plate potential from the cell plate potential generating circuit 41 is applied to all the cell plate electrodes of the capacitors 12 in the memory cells M11 to Mnn of the memory cell array 10. The read/write operation to the memory cell array 10 is similar to that to a related art DRAM.

According to the semiconductor storage device of the above preferred embodiment, information including test results and production history can be nonvolatily stored into a chip itself and read out therefrom. Accordingly, the information can be recognized for every chip in an electrical test. Further, since the information including test results and production history is stored in the chip, no recording on other storage media is required. Accordingly, the present invention is effective particularly in the case where a product code cannot be identified by marking as in shipping a semiconductor storage device in the form of wafer or chip. Further, it is unnecessary to incorporate a ROM (read only memory) in a RAM chip to store nonvolatile information. Further, the memory cell array 20 can be provided per word line and any of the memory cells M1m to Mnm+1 whose capacitors are to be destroyed can be selected by the column address signals, a plurality of pieces of information can be stored and limitation of information size can be suppressed.

In the case where the nonvolatile information storing memory cell array 20 is provided in a usual DRAM as in the above preferred embodiment, the structure of the memory cells M1m to Mnm+1 of the memory cell array 20 can be made the same as that of the memory cells M11 to Mnn of the volatile information storing memory cell array 10, thereby facilitating the production.

It is to be noted that the present invention is not limited to the above preferred embodiment. For example, the memory cell array for storing volatile information is not limited to a DRAM, but may be any other kinds of memories such as an SRAM (static random access memory).

What is claimed is:

1. A semiconductor storage device comprising:
   a volatile memory block and a nonvolatile memory block;
   said volatile memory block comprising:
      a bit line for column selection;
      a word line for row selection;
      a plurality of first memory cells arranged in the form of matrix, for storing volatile information; and
      a first read/write control means for control read/write operation to said first memory cells;
   said nonvolatile memory block comprising:
      a high potential line to be used for writing of nonvolatile information;
      a bit line to be used commonly to said volatile memory block;
      a plurality of second memory cells arranged in the form of matrix, for storing said nonvolatile information;
      a nonvolatile storage cell plate line; and
      a second read/write control means for controlling read/write operation to said second memory cells;
   each of said second memory cells comprising:
      a nonvolatile storage capacitor;
      a nonvolatile storage cell selecting transistor located between said bit line to be used commonly to said volatile memory block and one electrode of said nonvolatile storage capacitor;
      a switching means connected between the other electrode of said nonvolatile storage capacitor and said high potential line to be used for writing of nonvolatile information, and adapted to selectively switch on in writing into redundant storage cells; and
      a nonvolatile storage cell plate line.

2. A semiconductor storage device according to claim 1, wherein each of said first memory cells comprises:
   a volatile information storage capacitor;
   a volatile storage cell selecting transistor located between said bit line for column selection and one electrode of said volatile information storage capacitor; and
   a volatile storage cell plate line connected to the other electrode of said volatile information storage capacitor.

3. A semiconductor storage device according to claim 2, further comprising a switching means connected between said volatile storage cell plate and said nonvolatile storage cell plate, and adapted to switch off in writing nonvolatile information and switch on in another operation mode.

* * * * *